United States Patent [19]
Rountree

[11] Patent Number: 5,291,437
[45] Date of Patent: Mar. 1, 1994

[54] SHARED DUMMY CELL
[75] Inventor: Robert N. Rountree, Plano, Tex.
[73] Assignee: Texas Instruments Incorporated, Dallas, Tex.
[21] Appl. No.: 904,359
[22] Filed: Jun. 25, 1992
[51] Int. Cl.[5] ............................................... G11C 7/00
[52] U.S. Cl. .................................. 365/149; 365/203; 365/205; 365/206
[58] Field of Search ............... 365/149, 203, 205, 207, 365/206

[56] References Cited
U.S. PATENT DOCUMENTS
4,758,987  7/1988  Sakui ........................................ 365/203
4,841,483  6/1989  Furuyama .................................. 365/202

Primary Examiner—Eugene R. LaRoche
Assistant Examiner—Viet Q. Nguyen
Attorney, Agent, or Firm—Ronald O. Neerings; James C. Kesterson; Richard L. Donaldson

[57] ABSTRACT

The present invention describes a circuit and method for utilizing a single dummy cell for each sense amplifier in a dynamic random access memory (DRAM) device. A precharge transistor connects a dummy cell capacitor to a reference potential and decoded selection transistors. The use of decoded selection transistors provides a means to share the dummy cell capacitor between either input of a differential or sense amplifier thereby reducing required area and circuit complexity.

20 Claims, 3 Drawing Sheets

SHARED DUMMY CELL

FIELD OF THE INVENTION

The present invention relates to the field of integrated circuit devices. More specifically, the present invention relates to a shared dummy cell for a sense amplifier in a memory device.

BACKGROUND OF THE INVENTION

Integrated circuits formed using complementary-metal-oxide-semiconductor (CMOS) processes for dynamic random access memory (DRAM) applications typically use memory cells consisting of a single transistor and capacitor to minimize area. Stored charge on the capacitor representing a data state is accessed when a selected wordline turns on the associated transistor. This results in charge sharing between the cell capacitor and bitline connected to source and drain regions of the transistor. Because the capacitance of the bitline is much larger than that of the memory cell, the change in voltage after charge sharing may be quite small and is given by the equation $Vf=(Vbl+A*Vc)/(1+A)$ where Vbl is the bitline precharge voltage, Vc is the memory cell voltage and A is the ratio of storage cell capacitance to bitline capacitance.

Practical operation of the memory device is further constrained by the fact that stored charge in the memory cell gradually leaks away in an asymmetrical manner. For example, a memory cell with a voltage representing a logical one might leak much more than a memory cell with a voltage representing a logical zero. In order to overcome these limitations typical DRAMs utilize complementary bitline pairs for differential sensing of the small signal. Additionally, a special cell or dummy cell is often connected to the complementary bitline and precharged to a reference potential. After charge sharing the complementary bitline voltage is given by $Vf'=(Vbl+B*Vd)/(1+B)$ where Vbl is the bitline precharge voltage, Vd is the dummy cell voltage and B is the ratio of dummy cell capacitance to bitline capacitance. Adjustment of either the dummy cell size or voltage will modify Vf' so that the signal available for sensing (Vf−Vf') is approximately the same even after asymmetrical cell leakage.

In practice, each bitline of the complementary pair has an equal number of memory cells. Previous designs have typically used at least two and perhaps four dummy cells for each sense amplifier so that selection of a memory cell on one bitline corresponds to selection of a dummy cell on the complementary bitline. Since a typical 16 megabit DRAM may have more than 34,816 sense amplifiers, a considerable amount of area is expended on dummy cells. The present invention describes a means to utilize only a single dummy cell for each sense amplifier thereby reducing required area and circuit complexity.

SUMMARY OF THE INVENTION

The present invention disclosed herein comprises a dummy cell capacitor, a precharge transistor to connect the capacitor to a reference potential and decoded selection transistors. The use of decoded selection transistors provides a means to share the dummy cell capacitor between either input of a differential or sense amplifier thereby reducing required area and circuit complexity.

DETAILED DESCRIPTION OF PREFERRED EMBODIMENTS

Figure 1:
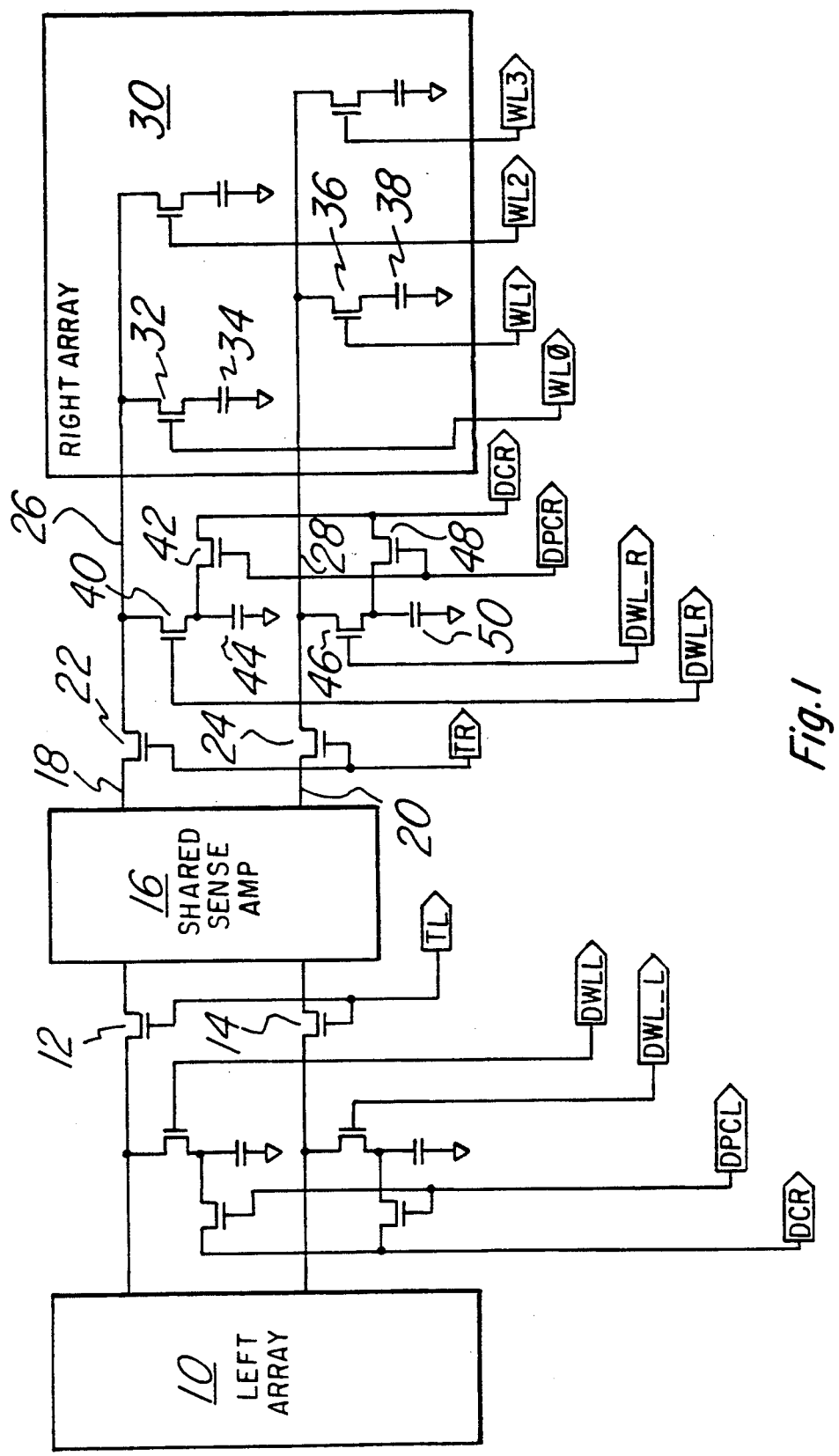
FIG. 1 illustrates a dummy cell circuit of related art for a shared sense amplifier configuration.

Referring to FIG. 1, there is illustrated a shared sense amplifier 16 selectively connected by transistors 12 and 14 or 22 and 24 to either of memory arrays 10 or 30 respectively and a dummy cell circuit comprised of precharge transistors 42 and 48, select transistors 40 and 46 and capacitors 44 and 50. During precharge or when the circuit is not selected TL and TR enable transistors 12, 14, 22 and 24 so that sense nodes 18 and 20 are connected to bitlines 26 and 28. Dummy wordlines DWLR and DWL_R disable select transistors 40 and 46 and precharge transistors 42 and 48 are enabled by dummy cell precharge signal DPCR to precharge capacitors 44 and 50 to dummy cell reference potential DCR. When data is read from the right array, TL disables transistors 12 and 14 so sense nodes 18 and 20 are only connected to bitlines 26 and 28 respectively and DPCR disables precharge transistors 42 and 48. A selected wordline from the right array, for example WLO, enables transistor 32 and charge is shared between storage cell capacitor 34 and bitline 26. Dummy wordline DWL_R enables transistor 46 and charge is shared between dummy cell capacitor 50 and complementary bitline 28. A difference voltage is thereby produced at input terminals 18 and 20 of sense amplifier 16. The read operation is functionally equivalent for a storage cell on either bitline in either array.

Figure 2:
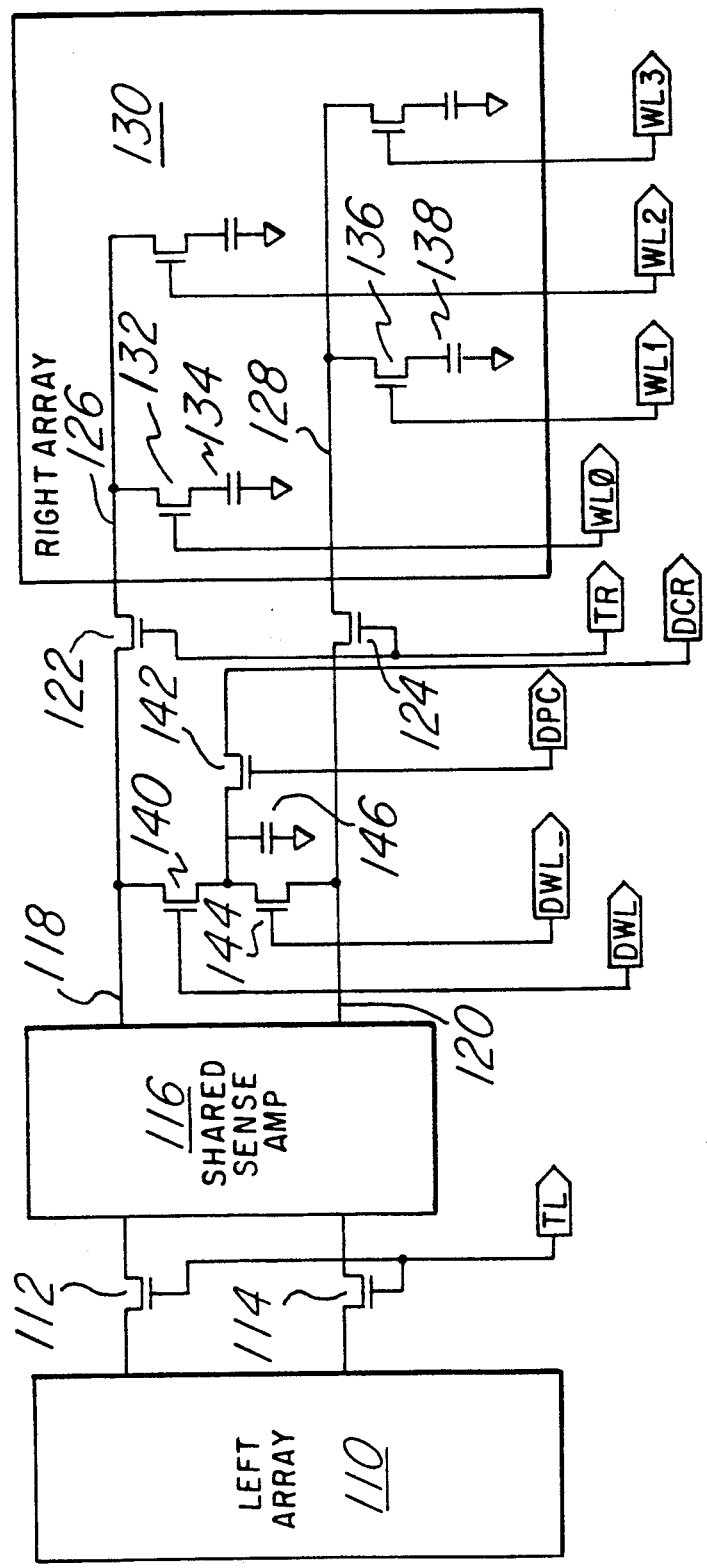
FIG. 2 illustrates a sense amplifier having a single sided dummy cell according to one embodiment of the present invention.

Referring now to FIG. 2, there is illustrated a schematic diagram of the present invention. A shared sense amplifier 116 selectively connected by transistors 112 and 114 or 122 and 124 to either of memory arrays 110 or 130 respectively. The shared dummy cell circuit is comprised of precharge transistor 142, select transistors 140 and 144 and capacitor 146. During precharge or when the circuit is not selected TL and TR enable transistors 112, 114, 122 and 124 so that sense nodes 118 and 120 are connected to bitlines 126 and 128. Dummy wordlines DWL and DWL$_{13}$ disable select transistors 140 and 144 and precharge transistor 142 is enabled by dummy cell precharge signal DPC to precharge capacitor 146 to dummy cell reference potential DCR. When data is read from the right array, TL disables transistors 112 and 114 so sense nodes 118 and 120 are only connected to bitlines 126 and 128 respectively and DPC disables precharge transistor 142. A selected wordline from the right array, for example WLO, enables transistor 132 and charge is shared between storage cell capacitor 134 and bitline 126. Dummy wordline DWL_ enables transistor 144 and charge is shared between dummy cell capacitor 146 and sense node 120. A difference voltage is thereby produced at input terminals 118 and 120 of sense amplifier 116. The read operation is functionally equivalent for a storage cell on either bitline in either array.

Figure 3:
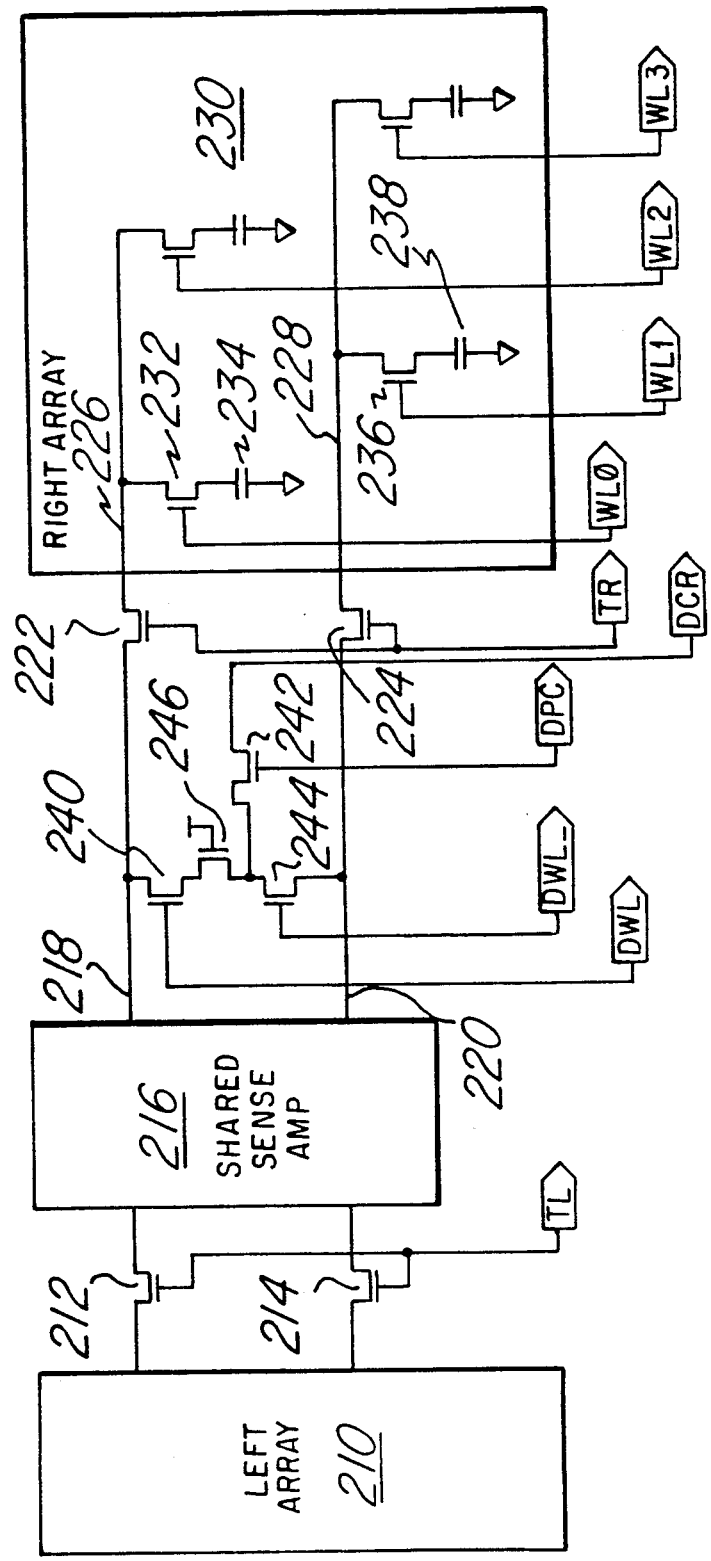
FIG. 3 illustrates a sense amplifier having a single sided dummy cell according to another embodiment of the present invention.

Referring now to FIG. 3, there is illustrated a schematic diagram of another embodiment of the present invention. A shared sense amplifier 216 selectively connected by transistors 212 and 214 or 222 and 224 to either of memory arrays 210 or 230 respectively. The shared dummy cell circuit is comprised of precharge transistor 242, select transistors 240 and 244 and transistor 246. During precharge or when the circuit is not selected TL and TR enable transistors 212, 214, 222 and 224 so that sense nodes 218 and 220 are connected to bitlines 226 and 228. Dummy wordlines DWL and DWL_disable select transistors 240 and 244 and precharge transistor 242 is enabled by dummy cell precharge signal DPC to precharge the source, drain and inversion layer of transistor 246 to dummy cell reference potential DCR. When data is read from the right array, TL disables transistors 212 and 214 so sense nodes 218 and 220 are only connected to bitline 226 and 228 respectively and DPC disables precharge transistor 242. A selected wordline from the right array, for example WL0, enables transistor 232 and charge is shared between storage cell capacitor 234 and bitline 226. Dummy wordline DWL_enables transistor 244 and charge is shared between the gate oxide capacitance of transistor 246 and sense node 220. A difference voltage is thereby produced at input terminals 218 and 220 of sense amplifier 216. The read operation is functionally equivalent for a storage cell on either bitline in either array.

In summary, there has been provided a dummy cell circuit which uses a single dummy cell capacitor and precharge transistor. These common elements are shared between complementary sense nodes by activation of either of two dummy wordlines. Being connected to the sense nodes, the dummy cell circuit is shared between left and right memory arrays as well. When compared to the related art circuit of FIG. 1 for a 16 megabit DRAM, total circuit elements are reduced by 253,952 for a substantial reduction in area.

What is claimed is:

1. A dummy cell circuit, comprising:
   a capacitive element;
   a means for charging said capacitive element to a reference potential; and
   a means for selectively connecting said capacitive element to a selected one of two or more terminals.

2. The dummy cell circuit of claim 1 wherein said two or more terminals comprise the input-output terminals of a differential amplifier.

3. The dummy cell circuit of claim 1 wherein said two or more terminals comprise the bitline terminals of one or more memory arrays.

4. The dummy cell circuit of claim 1 wherein said capacitive element is a capacitor.

5. The dummy cell circuit of claim 1 wherein said capacitive element is a transistor.

6. The dummy cell circuit of claim 1 wherein the means for charging the capacitive element to a reference potential is a precharge transistor selectively connecting the capacitive element to the reference potential.

7. The dummy cell circuit of claim 1 wherein the means for selectively connecting the capacitive element to one of said two or more terminals is decoded selection transistors for selectively connecting the capacitive element to one of said terminals.

8. A method of forming a dummy cell circuit, comprising:
   forming a capacitive element;
   forming a means for charging said capacitive element to a reference potential; and
   forming a means for selectively connecting said capacitive element to a selected one or two or more terminals.

9. The dummy cell circuit of claim 1 wherein said two or more terminals comprise the input-output terminals of a differential amplifier and the bitline terminals of one or more memory arrays.

10. The dummy cell circuit of claim 1 wherein said means for charging said capacitive element to a reference potential is a single precharge transistor selectively connecting said capacitive element to said reference potential.

11. The dummy cell circuit of claim 1 wherein said means for selectively connecting said capacitive element to a selected one of two or more terminals is two decoded selection transistors for selectively connecting said capacitive element to a selected one of said terminals.

12. A dummy cell circuit, comprising:
    a single capacitive element;
    a single switching means for selectively connecting said capacitive element to a reference potential; and
    a means for selectively connecting said capacitive element to a selected one of two or more terminals.

13. The dummy cell circuit of claim 12 wherein said single switching means is a transistor.

14. The dummy cell circuit of claim 13 wherein a first electrode of said transistor is connected to said reference potential, a second electrode of said transistor is connected to said capacitive element, and a control electrode of said transistor is coupled to receive a dummy cell precharge signal.

15. The dummy cell circuit of claim 12 wherein said means for selectively connecting said capacitive element to a selected one of two or more terminals is a first transistor for selectively connecting said capacitive element to a first of said terminals, and a second transistor for selectively connecting said capacitive element to a second of said terminals.

16. The dummy cell circuit of claim 15 wherein a first electrode of said first transistor is connected to said first terminal, a second electrode of said first transistor is connected to said capacitive element, a control electrode of said first transistor is coupled to receive a first dummy word line select singal, a first electrode of said second transistor is connected to said capacitive element, a second electrode of said second transistor is connected to said second terminal, and a control electrode of said second transistor is coupled to receive a second dummy word line select signal.

17. The dummy cell circuit of claim 16 wherein said capacitive element is a capacitor having a first terminal connected to substrate and a second terminal connected to said second electrode of said switching means transistor, to said second electrode of said first transistor and to said first electrode of said second transistor.

18. The dummy cell circuit of claim 16 wherein said capacitive element is a transistor having a first electrode connected to said second electrode of said switching means transistor, a control electrode connected to a reference voltage, and a second electrode connected to said second electrode of said switching means transistor and to said first electrode of said second transistor.

19. The dummy cell circuit of claim 1 wherein said terminals are sense nodes of a sense amplifier.

20. The dummy cell circuit of claim 12 wherein said terminals are sense nodes of a sense amplifier.

* * * * *